(12) United States Patent
Antunez et al.

(10) Patent No.: US 10,396,707 B2
(45) Date of Patent: Aug. 27, 2019

(54) INTEGRATED CZT(S,SE) PHOTOVOLTAIC DEVICE AND BATTERY

(71) Applicant: International Business Machines Corporation, Armonk, NY (US)

(72) Inventors: Priscilla D. Antunez, Tarrytown, NY (US); Richard A. Haight, Mahopac, NY (US); James B. Hannon, Lake Lincolndale, NY (US); Teodor K. Todorov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 109 days.

(21) Appl. No.: 15/281,870

(22) Filed: Sep. 30, 2016

(65) Prior Publication Data

US 2018/0097473 A1 Apr. 5, 2018

(51) Int. Cl.
*H02S 40/38* (2014.01)
*H01L 31/18* (2006.01)
(Continued)

(52) U.S. Cl.
CPC ...... *H02S 40/38* (2014.12); *H01L 31/022441* (2013.01); *H01L 31/022466* (2013.01);
(Continued)

(58) Field of Classification Search
CPC ...... H02S 40/38; H02S 40/36; H01M 10/465; H01M 10/0525; H01L 31/1876;
(Continued)

(56) References Cited

U.S. PATENT DOCUMENTS

| 8,426,241 B2 | 4/2013 | Ahmed et al. |
| 2009/0092903 A1* | 4/2009 | Johnson ............ H01M 4/0471 |
| | | 429/322 |

(Continued)

FOREIGN PATENT DOCUMENTS

| CN | 202352792 U | 7/2012 |
| CN | 102800734 A | 11/2012 |

(Continued)

OTHER PUBLICATIONS

Mitzi et al., "Prospects and performance limitations for Cu-Zn-Sn-S-Se photovoltaic technology," Phil Trans R Soc A 371 (Jul. 2013).

(Continued)

*Primary Examiner* — Matthew T Martin
(74) *Attorney, Agent, or Firm* — Vazken Alexanian; Michael J. Chang, LLC (57) ABSTRACT

An integrated kesterite (e.g., CZT(S,Se)) photovoltaic device and battery is provided. In one aspect, a method of forming an integrated photovoltaic device and battery includes: forming a photovoltaic device having a substrate, an electrically conductive layer, an absorber layer, a buffer layer, a transparent front contact, and a metal grid; removing the substrate and the electrically conductive layer from the photovoltaic device to expose a backside surface of the absorber layer; forming at least one back contact on the backside surface of the absorber layer; and integrating the photovoltaic device with a battery, wherein the integrating includes connecting i) a positive contact of the battery with the back contact on the backside surface of the absorber layer and ii) a negative contact of the battery with the metal grid on the transparent front contact. An integrated photovoltaic device and battery is also provided.

18 Claims, 10 Drawing Sheets

(51) Int. Cl.
*H01M 10/0525* (2010.01)
*H01M 10/46* (2006.01)
*H01L 31/072* (2012.01)
*H01L 31/032* (2006.01)
*H01L 31/0224* (2006.01)
*H02S 40/36* (2014.01)
*H01M 10/052* (2010.01)
*H01M 10/0562* (2010.01)
*H01L 31/048* (2014.01)

(52) U.S. Cl.
CPC ........ *H01L 31/0326* (2013.01); *H01L 31/048* (2013.01); *H01L 31/072* (2013.01); *H01M 10/052* (2013.01); *H01M 10/0562* (2013.01); *H01M 10/465* (2013.01); *H02S 40/36* (2014.12); *H01L 31/186* (2013.01); *H01L 31/1868* (2013.01); *H01L 31/1876* (2013.01); *H01L 31/1884* (2013.01); *H01M 2300/0071* (2013.01); *Y02E 60/122* (2013.01)

(58) Field of Classification Search
CPC ......... H01L 31/1884; H01L 31/022441; H01L 31/186; H01L 31/0525; H01L 31/022466; H01L 31/0326; H01L 31/1868; H01L 31/02167; H01L 31/072
See application file for complete search history.

(56) References Cited

U.S. PATENT DOCUMENTS

| | | | |
|---|---|---|---|
| 2011/0232761 A1* | 9/2011 | Lomasney | H01L 31/02021 136/262 |
| 2012/0100663 A1 | 4/2012 | Bojarczuk et al. | |
| 2012/0109503 A1 | 5/2012 | Yang et al. | |
| 2013/0037110 A1 | 2/2013 | Mitzi et al. | |
| 2013/0037111 A1 | 2/2013 | Mitzi et al. | |
| 2013/0164886 A1* | 6/2013 | Liang | H01L 21/02472 438/95 |

FOREIGN PATENT DOCUMENTS

| | | |
|---|---|---|
| CN | 103163958 | 6/2013 |
| CN | 203217476 U | 9/2013 |
| CN | 103390674 A * | 11/2013 |
| CN | 203735676 U | 7/2014 |
| CN | 203800861 U | 8/2014 |
| CN | 102938571 B | 5/2015 |
| CN | 205191462 U | 4/2016 |
| DE | 202006013497 U1 | 12/2006 |

OTHER PUBLICATIONS

Shin et al., "Control of an interfacial MoSe2 layer in Cu2ZnSnSe4 thin film solar cells: 8.9% power conversion efficiency with a TiN diffusion barrier," Applied Physics Letters 101, 053903-1-4 (Jul. 2012).

Fleutot et al., "GaSe Formation at the Cu(In,Ga)Se2/Mo Interface-A Novel Approach for Flexible Solar Cells by Easy Mechanical Lift-Off," Adv. Mater. Interfaces 1400044 (May 2014) (12 pages).

Goriparti et al., "Review on recent progress of nanostructured anode materials for Li-ion batteries," Journal of Power Sources, 257, pp. 421-443 (Jan. 2014).

Dullweber et al., "Back surface band gap gradings in Cu(In,Ga)Se2 solar cells," Thin Solid Films, vol. 387, 11-13 (May 2001).

Gibson et al., "Solar photovoltaic charging of lithium-ion batteries," 2009 IEEE Vehicle Power and Propulsion Conference, VPPC '09, pp. 310-316 (Sep. 2009).

English Translation of CN203217476U by Zhang Xianneng, dated Sep. 25, 2013.

English Translation of CN205191462U by Wang Zhan, dated Apr. 27, 2016.

English Translation of CN203800861U by Yang Liping et al., dated Aug. 27, 2014.

English Translation of CN203735676U by Wang Bo, dated Jul. 30, 2014.

English Translation of CN202352792U by Yi Jin, et al., dated Jul. 25, 2012.

English Translation of CN103163958A by Yangzhou City Baoyang Digital Science & Tech., dated Jun. 19, 2013.

English Translation of CN102800734A by Dongdong Li et al., dated Nov. 28, 2012.

English Translation of CN102938571B by Wang Weiming et al., dated May 27, 2015.

English Translation of DE202006013497U1 by Knirps Promotion Gmbh & Co., dated Dec. 7, 2006.

* cited by examiner

FIG. 1

Battery/PV/Low power Device

FIG. 2

Battery

INTEGRATED CZT(S,SE) PHOTOVOLTAIC DEVICE AND BATTERY

FIELD OF THE INVENTION

The present invention relates to integrating photovoltaic devices with batteries to provide recharging capabilities and more particularly, to an integrated kesterite (e.g., CZT(S, Se)) photovoltaic device and battery.

BACKGROUND OF THE INVENTION

In order to power autonomous computers and sensors, for example in the area of the Internet of Things (IoT), batteries as an energy source alone are insufficient for devices deployed in remote locations and/or in use for extended time periods. Thus, energy harvesting is required, and the most ubiquitous source of energy is light. Hence, photovoltaic devices can be integrated with batteries to provide recharging capabilities. While such photovoltaic device/battery couplings exist, the available solutions have notable drawbacks such as the use of expensive and rare or toxic materials or, in the alternative, abundant/non-toxic silicon which is not applicable to thin film photovoltaics.

Ultra-small, ultra-low power computers require power to be supplied at constant voltage. Standard lithium (Li)-ion batteries operate at ~3-4 volts (V), which is too high for low power computers. Therefore, integrated circuit (IC) voltage regulation is needed which wastes energy. Additionally, non-toxic materials for wide deployment in the environment are a requirement along with a spatially small footprint.

Accordingly, improved photovoltaic device and battery integrated designs would be desirable.

SUMMARY OF THE INVENTION

The present invention provides an integrated kesterite (e.g., CZT(S,Se)) photovoltaic device and battery. In one aspect of the invention, a method of forming an integrated photovoltaic device and battery is provided. The method includes: forming a photovoltaic device having a substrate, an electrically conductive layer on the substrate, an absorber layer on the electrically conductive layer, a buffer layer on the absorber layer, a transparent front contact on the buffer layer, and a metal grid on the transparent front contact; removing the substrate and the electrically conductive layer from the photovoltaic device to expose a backside surface of the absorber layer; forming at least one back contact on the backside surface of the absorber layer; and integrating the photovoltaic device with a battery, wherein the battery includes a positive contact and a negative contact, and wherein the integrating includes connecting i) the positive contact of the battery with the back contact on the backside surface of the absorber layer and ii) the negative contact of the battery with the metal grid on the transparent front contact.

In another aspect of the invention, an integrated photovoltaic device and battery is provided. The integrated photovoltaic device and battery includes: a photovoltaic device having an absorber layer, a buffer layer on the absorber layer, a transparent front contact on the buffer layer, and a metal grid on the transparent front contact; at least one back contact on a backside surface of the absorber layer; and a battery having a positive contact and a negative contact, wherein i) the positive contact of the battery is connected to the back contact on the backside surface of the absorber layer and ii) the negative contact of the battery is connected to the metal grid on the transparent front contact.

A more complete understanding of the present invention, as well as further features and advantages of the present invention, will be obtained by reference to the following detailed description and drawings.

DETAILED DESCRIPTION OF PREFERRED EMBODIMENTS

Provided herein are non-toxic, earth abundant, inexpensive photovoltaic devices fabricated from CZT(S,Se) operating at from about 1 volt (V) to about 2V, and ranges therebetween, coupled with a lithium (Li)-ion battery whose chemistry is optimized to provide voltage in this range. The present rechargeable integrated photovoltaic device and battery design permits operation under low light conditions (e.g., at 0.001 suns or less), is ultra-thin (e.g., the complete integrated structure has a thickness of less than about 500 micrometers (μm)), and is scalable to an area less than 100 μm.

Most commercially available photovoltaic rechargeable devices include crystalline, polycrystalline or amorphous silicon-based solar cells. However, since silicon is a poor light absorber, the thickness of the silicon alone must be at least about 300 micrometers (μm) and thus is not considered "thin film" technology. Thin film photovoltaic technology includes absorber materials such as CZT(S,Se), CIG(S,Se), cadmium telluride (CdTe), and gallium arsenide (GaAs). CIG(S,Se) includes copper (Cu), indium (In), gallium (Ga), and at least one of sulfur (S) and selenium (Se). In and Ga, however, are both rare elements which makes CIG(S,Se) expensive to implement in large-scale production. CdTe uses toxic Cd, and GaAs uses toxic As and is very expensive to fabricate since GaAs needs to be grown as a single crystal on expensive substrates such as indium phosphide (InP).

CZT(S,Se), on the other hand, is an efficient absorber material that includes earth abundant, non-toxic elements. As its name implies, a CZT(S,Se) material contains copper (Cu), zinc (Zn), tin (Sn), and at least one of sulfur (S) and selenium (Se). For a general discussion on kesterites and use of kesterite in solar cells, see, for example, Mitzi et al., "Prospects and performance limitations for Cu—Zn—Sn—S—Se photovoltaic technology," Phil Trans R Soc A 371 (July 2013), the contents of which are incorporated by reference as if fully set forth herein.

With regard to the battery component, typical lithium (Li)-ion chemistries have been optimized to supply from about 3V to about 4V which is too high for ultra low power computers and sensors. Thus, for such application, the battery output needs to be stepped down in voltage using integrated circuit (IC) voltage regulation which wastes energy.

Figure 1:
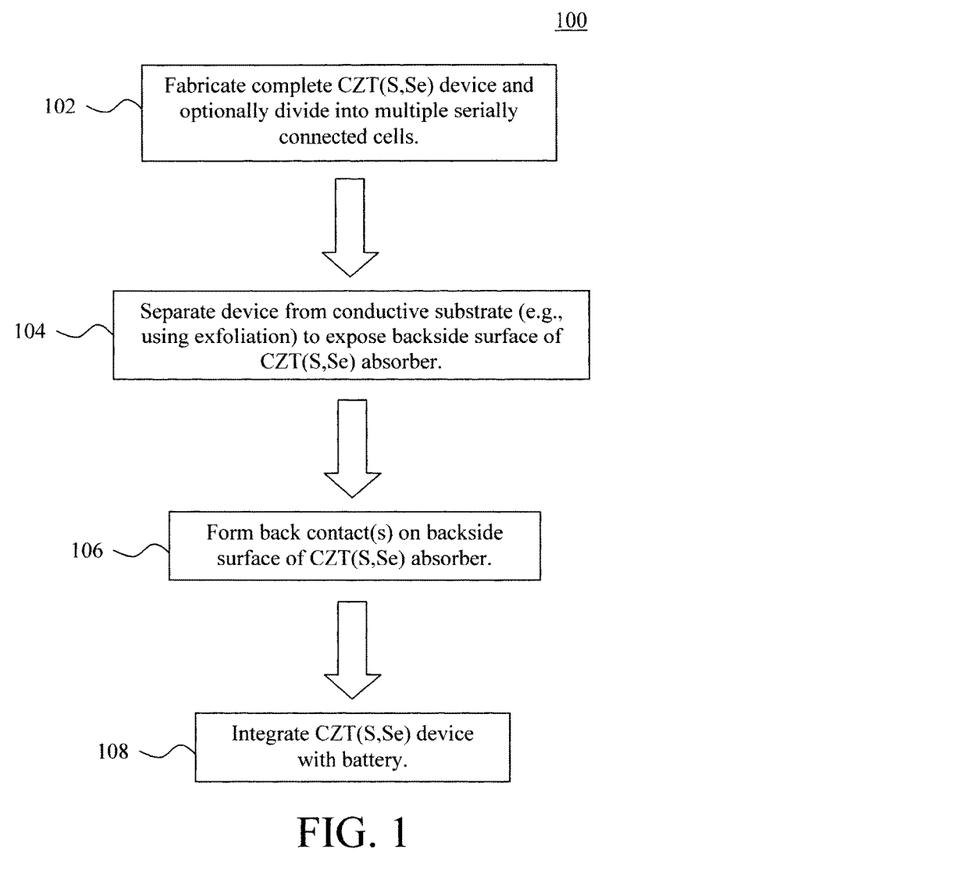
FIG. 1 is a diagram illustrating an exemplary methodology for forming an integrated CZT(S,Se) photovoltaic device and battery according to an embodiment of the present invention.

An overview of the present techniques is now provided by way of reference to methodology 100 of FIG. 1. In step 102, a complete CZT(S,Se)-based photovoltaic device is fabricated. By "CZT(S,Se)-based" it is meant that CZT(S,Se) serves as the absorber layer of the photovoltaic device. Forming a complete photovoltaic device at the beginning of the process enables all of the necessary steps to be undertaken to produce a high quality device, such as building the device on a molybdenum (Mo)-coated soda-lime glass (SLG) substrate (see below) which is beneficial in terms of coefficient of thermal expansion (CTE) matching between the device and the substrate, it permits the formation of beneficial secondary compounds such as $MoS_2$ and/or $MoSe_2$, etc. See, for example, Shin et al., "Control of an interfacial $MoSe_2$ layer in $Cu_2ZnSnSe_4$ thin film solar cells: 8.9% power conversion efficiency with a TiN diffusion barrier," Applied Physics Letters 101, 053903-1-4 (July 2012), the contents of which are incorporated by reference as if fully set forth herein.

In order to increase the output of the photovoltaic component under typical indoor light conditions (e.g., 0.001 watts per square centimeter (watts/$cm^2$) or less), it is preferable to divide the CZT(S,Se)-based photovoltaic device into multiple cells connected in series. Thus, according to an exemplary embodiment, the active layers of the CZT(S,Se)-based photovoltaic device (see below) are isolated via scribe lines, and the individual cells connected via a metal grid to achieve the appropriate voltage.

In step 104, the complete CZT(S,Se)-based photovoltaic device is then separated from the substrate (e.g., from the Mo-coated SLG substrate). As will be described in detail below, separating the CZT(S,Se)-based photovoltaic device from the substrate can be carried out using an exfoliation process. For instance, a glass or polymer plate can be attached (e.g., using an adhesive such as an epoxy) to the top of the CZT(S,Se)-based photovoltaic device, followed by a sharp impulse on the glass plate to separate (i.e., exfoliate) the CZT(S,Se)-based photovoltaic device from the Mo-coated SLG substrate. See, for example, Fleutot et al., "GaSe Formation at the Cu(In,Ga)$Se_2$/Mo Interface-A Novel Approach for Flexible Solar Cells by Easy Mechanical Lift-Off," Adv. Mater. Interfaces 1400044 (May 2014) (12 pages), the contents of which are incorporated by reference as if fully set forth herein.

Separating the CZT(S,Se)-based photovoltaic device from the substrate exposes a backside surface of the CZT(S,Se) absorber. In step 106, a (positive) back contact(s) is then formed on the backside surface of the CZT(S,Se) absorber. According to an exemplary embodiment, the back contact includes a molybdenum trioxide ($MoO_3$) layer on the CZT(S,Se) absorber, followed by a metal capping layer such as gold (Au). When, as described above, the CZT(S,Se)-based photovoltaic device has been divided into multiple serially connected cells, the back contact is formed individually on the backside surface of each cell. That way, the output from the last cell in the series can be individually obtained.

As will be described in detail below, when the CZT(S,Se)-based photovoltaic device is integrated with the battery component, the positive part of the battery will be connected to the last back contact in the series with the highest voltage, while the negative part of the battery will be connected to the tops of each cell. Thus, the top and bottom sides of the CZT(S,Se)-based photovoltaic device may also be referred to herein as the negative and positive sides, respectively, of the CZT(S,Se)-based photovoltaic device. Additionally, embodiments are also anticipated herein where both the negative and positive parts of the CZT(S,Se)-based photovoltaic device are accessed from the bottom side of the CZT(S,Se)-based photovoltaic device (wherein the negative part is accessed via a through contact that passes from the top to the bottom sides of the CZT(S,Se)-based photovoltaic device).

Finally, in step 108 the CZT(S,Se)-based photovoltaic device is integrated with the battery. As will be described in detail below, several different configurations are anticipated. For instance, in one exemplary embodiment, the CZT(S,Se)-based photovoltaic device is placed on top of the battery where the positive and negative battery contacts are on the top and bottom of the battery, respectively, and the negative battery contact is connected to the top side of the CZT(S,Se)-based photovoltaic device via a wire. In an alternative embodiment, the CZT(S,Se)-based photovoltaic device is also placed on top of the battery, however both the positive and negative battery contacts are on the top of the battery, and the negative battery contact is accessed at the bottom of the CZT(S,Se)-based photovoltaic device via a through contact that passes from the top to the bottom sides of the CZT(S,Se)-based photovoltaic device.

Figure 2:
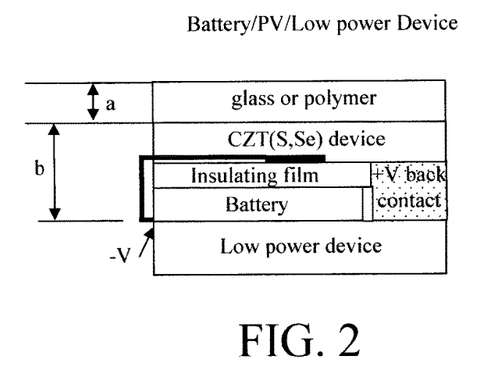
FIG. 2 is a cross-sectional diagram illustrating an exemplary configuration of the integrated CZT(S,Se) photovoltaic device and battery according to an embodiment of the present invention.

An exemplary configuration of the integrated CZT(S,Se) photovoltaic device and battery is shown in FIG. 2. As shown in FIG. 2, the CZT(S,Se) photovoltaic device and battery are oriented in a stack. For illustrative purposes, a low power device is shown also integrated in the stack which runs on the power supplied by the battery. The battery, in turn, is recharged via the CZT(S,Se) photovoltaic device. For instance, the battery is connected to the output terminals of the CZT(S,Se) photovoltaic device that under light produces from about 1V to about 2V, and ranges therebetween, e.g., about 1.3V, and is used to charge the battery.

By way of example only, the Internet of Things (IoT) includes a variety of interconnected physical entities (such as vehicles, buildings, etc.) having associated electronics such as computing devices, sensors, actuators, and communications capabilities that enable data collection and exchange amongst the entities. Any of these IoT components can be powered via the present CZT(S,Se) photovoltaic device/battery design.

As shown in FIG. 2, the CZT(S,Se) photovoltaic device is present on top of the battery, such that a positive part of the battery is connected to a back contact on the bottom/positive (+V) side of the CZT(S,Se) photovoltaic device, and a negative part of the battery is connected to a top/negative (−V) side of the CZT(S,Se) photovoltaic device.

The glass or polymer plate is shown attached to the top of the CZT(S,Se) photovoltaic device. As provided above, this plate is used in the exfoliation process to remove the CZT(S,Se) photovoltaic device from the substrate on which it is fabricated. According to an exemplary embodiment, the glass or polymer plate has a thickness a of from about 50 micrometers (μm) to about 2 mm, and ranges therebetween. By comparison, the CZT(S,Se) photovoltaic device and battery have a combined thickness b of from about 4 μm to about 5 μm, and ranges therebetween.

Figure 3:
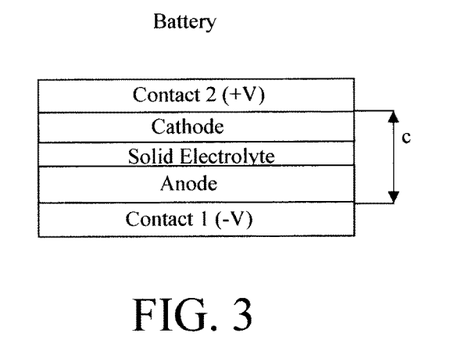
FIG. 3 is a cross-sectional diagram illustrating an exemplary configuration of the battery according to an embodiment of the present invention.

An exemplary configuration of the battery is shown in FIG. 3. As shown in FIG. 3, the battery includes a first (negative) contact (contact 1), an anode separated from a cathode by an electrolyte, and a second (positive) contact (contact 2). According to an exemplary embodiment, the battery is a Li-ion battery, wherein the cathode includes lithium cobalt oxide ($LiCoO_2$), lithium iron phosphate ($LiFePO_4$), lithium manganese oxide ($Li_2MnO_3$), and/or lithium nickel manganese cobalt oxide ($LiNiMnCoO_2$). According to an exemplary embodiment, a solid electrolyte is employed, such as amorphous lithium lanthanum titanate ($LiLaTiO_3$). The electrolyte acts as an electron barrier but allows Li ions to diffuse through the electrolyte as the battery is charged or discharged.

Suitable anode materials include, but are not limited to, vanadium (V) oxide ($V_2O_5$), graphite, carbon nanotubes, carbon nanofibers, silicon (Si), germanium (Ge), tin (Sn), nickel (Ni), and/or transition metal oxides such as lithium oxide and titanium oxide, etc. See, for example, Goriparti et al., "Review on recent progress of nanostructured anode materials for Li-ion batteries," Journal of Power Sources," 257, pgs. 421-443 (January 2014), the contents of which are incorporated by reference as if fully set forth herein. Suitable materials for the first (negative) contact include, but are not limited to, carbon (e.g., a conductive carbon paint), indium (In), etc. Suitable materials for the second (positive) contact include, but are not limited to, nickel (Ni) and/or copper (Cu). As shown in FIG. 3, the battery less the contacts (i.e., the anode, cathode, and electrolyte) has a combined thickness c of from about 1.5 μm to about 3 μm, and ranges therebetween.

Given the above overview of the present techniques, exemplary embodiments for forming the present integrated CZT(S,Se) photovoltaic device and battery are now described by way of reference to FIGS. 4-18. The embodiments each follow the same general process flow outlined in FIG. 1. Thus, reference will be made in the following description to the associated steps of methodology 100. For instance, in step 102 of methodology 100 a completed CZT(S,Se) device is fabricated.

According to an exemplary embodiment, the CZT(S,Se)-based photovoltaic device fabrication process begins with a suitable device substrate 402 coated with a layer 404 (or optionally multiple layers represented generically by layer 404) of an electrically conductive material. See FIG. 4.

Figure 4:
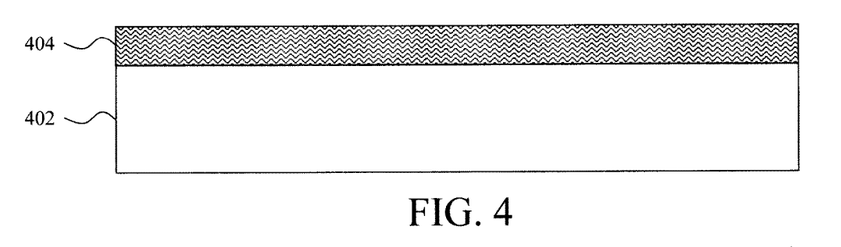
FIG. 4 is a cross-sectional diagram illustrating a substrate having a layer(s) of an electrically conductive material coated thereon according to an embodiment of the present invention.

Suitable substrates include, but are not limited to, soda lime glass (SLG), ceramic, metal foil, or plastic substrates. Suitable materials for forming conductive layer 404 include, but are not limited to, molybdenum (Mo), molybdenum trioxide ($MoO_3$), gold (Au), nickel (Ni), tantalum (Ta), tungsten (W), aluminum (Al), platinum (Pt), titanium nitride (TiN), silicon nitride (SiN), and combinations thereof. According to an exemplary embodiment, the conductive layer 404 is coated on the substrate 402 to a thickness of from about 100 nanometers (nm) to about 500 nm, and ranges therebetween. In general, the various layers of the device will be deposited sequentially using a combination of vacuum-based and/or solution-based approaches. For example, the electrically conductive material 404 can be deposited onto the substrate 402 using evaporation or sputtering.

Next, a CZT(S,Se) absorber layer 502 is formed on the conductive layer 404. See FIG. 5. As highlighted above, the CZT(S,Se) absorber layer 502 contains Cu, Zn, Sn, and at least one of S and Se. According to an exemplary embodiment, the CZT(S,Se) absorber layer 502 is formed having a total thickness of from about 0.5 μm to about 2 μm, and ranges therebetween.

Figure 5:
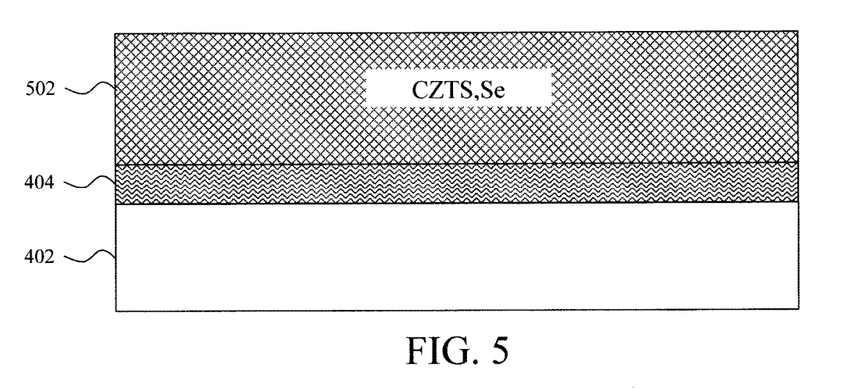
FIG. 5 is a cross-sectional diagram illustrating a CZT(S, Se) absorber layer having been formed on the conductive layer according to an embodiment of the present invention.
Figure 6:
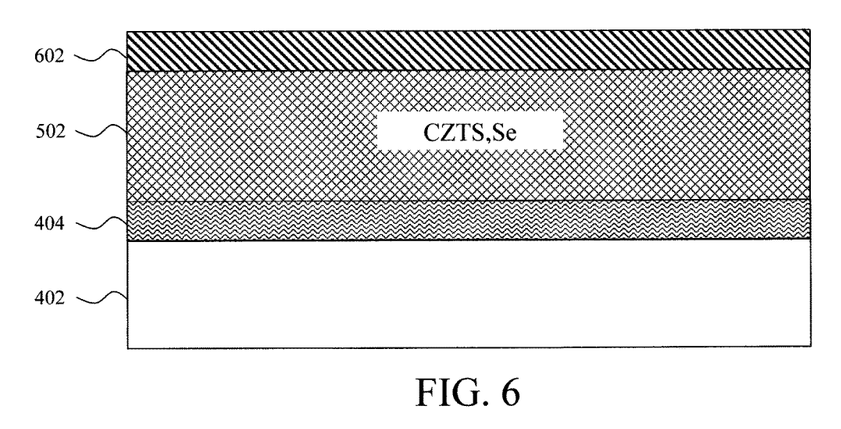
FIG. 6 is a cross-sectional diagram illustrating a buffer layer having been formed on the CZT(S,Se) absorber layer according to an embodiment of the present invention.

The CZT(S,Se) absorber layer 502 can be formed using vacuum-based, solution-based, or other suitable approaches to form a stack of layers. See for example U.S. Pat. No. 8,426,241 by Ahmed et al., entitled "Structure and Method of Fabricating a CZTS Photovoltaic Device by Electrodeposition," the contents of which are incorporated by reference as if fully set forth herein. The sequence of the layers in the stack can be configured to achieve optimal band grading and/or adhesion to the substrate. See, for example, Dullweber et al., "Back surface band gap gradings in Cu(In, Ga)Se$_2$ solar cells," Thin Solid Films, vol. 387, 11-13 (May 2001), the contents of which are incorporated by reference as if fully set forth herein.

Suitable solution-based kesterite fabrication techniques are described, for example, in U.S. Patent Application Publication Number 2013/0037111 by Mitzi et al., entitled "Process for Preparation of Elemental Chalcogen Solutions and Method of Employing Said Solutions in Preparation of Kesterite Films," the contents of which are incorporated by reference as if fully set forth herein. Suitable particle-based precursor approaches for CZT(S,Se) formation are described, for example, in U.S. Patent Application Publication Number 2013/0037110 by Mitzi et al., entitled "Particle-Based Precursor Formation Method and Photovoltaic Device Thereof," the contents of which are incorporated by reference as if fully set forth herein.

As will be described in detail below, the CZT(S,Se) photovoltaic device is preferably divided into a plurality of serially connected cells. According to an exemplary embodiment, the CZT(S,Se) absorber layer 502 is configured to reach higher single cell operating voltages (Vmpp=maximum power point voltage) by replacing some of the Se in the lattice with S which increases the band gap and hence the voltage. For instance, under 1 sun illumination open circuit voltages (Voc) of individual cells is preferably up to about 680 millivolts (mV). This is a distinct advantage for CZT(S,Se) because the band gap can be modified by the ratio of S to Se in the material.

For instance, during formation of the CZT(S,Se) absorber layer 502 the S and Se can be introduced via separately regulated (valve controlled) sources to control the ratio of S to Se. See, for example, U.S. Patent Application Publication Number 2012/0100663 filed by Bojarczuk et al., entitled "Fabrication of CuZnSn(S,Se) Thin Film Solar Cell with Valve Controlled S and Se," the contents of which are incorporated by reference as if fully set forth herein. For instance, pure sulfur (sulfide) would give the CZT(S,Se) absorber layer 502 a band gap of about 1.5 electron volts (eV) whereas pure selenium (selenide) would give the CZT(S,Se) absorber layer 502 a band gap of about 0.96 eV. According to an exemplary embodiment, the final CZT(S,Se) absorber layer 502 (i.e., post formation and anneal) has an S:Se ratio of from about 0 (i.e., pure Se) to about 1 (pure S), and ranges therebetween, e.g., from about 0.05 to about 0.95, and ranges therebetween.

Since the as-deposited materials have poor grain structure and a lot of defects, following deposition of the CZT(S,Se) materials a post anneal in a chalcogen environment is preferably performed. An anneal in a chalcogen (e.g., S and/or Se) environment improves the grain structure and defect landscape in the CZT(S,Se) material. According to an exemplary embodiment, the anneal is performed at a temperature of from about 500 degrees Celsius (° C.) to about 600° C., and ranges therebetween, to form a film composed of polycrystalline grains of from 1 µm to about 2 µm, and ranges therebetween, in size. Grain size is measured, for example, as the greatest length of the grain when viewed in cross-section. Performing the anneal in a chalcogen environment provides another opportunity to tune the S:Se ratio. Specifically, being volatile species, S and Se will evaporate from the film during the anneal. The chalcogen environment serves to replace these volatiles. Thus, by regulating a S:Se ratio in the chalcogen environment during the anneal, one can control the final S:Se ratio in the film. As provided above, the final CZT(S,Se) absorber layer 502 (i.e., post formation and anneal) is targeted to have an S:Se ratio of from about 0 (i.e., pure Se) to about 1 (pure S), and ranges therebetween, e.g., from about 0.05 to about 0.95, and ranges therebetween.

A thin film buffer layer 602 is then formed on the CZT(S,Se) absorber layer 502. See FIG. 6. The buffer layer 602 forms a p-n junction with the CZT(S,Se) absorber layer 502. According to an exemplary embodiment, the buffer layer 602 is formed having a thickness of from about 100 angstroms (Å) to about 1,000 Å, and ranges therebetween. Suitable buffer layer materials include, but are not limited to, cadmium sulfide (CdS), a cadmium-zinc-sulfur material of the formula $Cd_{1-x}Zn_xS$ (wherein $0<x\leq 1$), indium sulfide ($In_2S_3$), zinc oxide, zinc oxysulfide (e.g., a Zn(O,S) or Zn(O,S,OH) material), and/or aluminum oxide ($Al_2O_3$). According to an exemplary embodiment, the buffer layer 602 is deposited on the CZT(S,Se) absorber layer 502 using standard chemical bath deposition.

A transparent front contact 702 is then formed on the buffer layer 602. See FIG. 7. Suitable transparent front contact materials include, but are not limited to, transparent conductive oxides (TCOs) such as indium-tin-oxide (ITO) and/or aluminum (Al)-doped zinc oxide (ZnO) (AZO)). According to an exemplary embodiment, the transparent front contact 702 is formed on the buffer layer 602 by sputtering.

Figure 7:
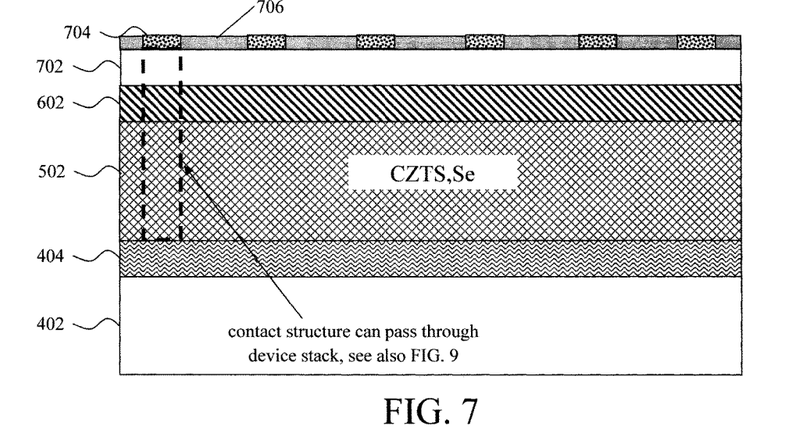
FIG. 7 is a cross-sectional diagram illustrating a transparent front contact having been formed on the buffer layer and a metal grid having been formed on the transparent front contact according to an embodiment of the present invention.

A metal grid 704 is than formed on the transparent front contact 702. Suitable materials for forming the metal grid 704 include, but are not limited to, Ni and/or Al. According to an exemplary embodiment, the metal grid 704 is formed on the transparent front contact 702 using evaporation or sputtering. According to an exemplary embodiment, a portion of the metal grid 704 is a through contact that passes from a top to a bottom of the CZT(S,Se) photovoltaic device. See, for example, FIG. 7 where it is shown that the metal grid 704 can pass through the device stack. It is notable that while dotted lines are used in conjunction with one of the contacts 704 to show that it passes through the device stack, in practice all contacts 704 shown would pass through the stack. Light shines down on the device from the front where the metal grid 704 is used to collect the electrons in the front (i.e., negative contact). This negative charge needs to be conveyed to the back which is done via the through contacts. See also FIG. 13. This through contact configuration will allow access to the top/negative part of the CZT(S,Se) photovoltaic device from the bottom side simply by accessing the through contact at the bottom of the CZT(S,Se) photovoltaic device. As such, battery/CZT(S,Se) photovoltaic device configurations can be implemented where both positive and negative terminals of the battery are on top of the battery, and are integrated with the positive and negative parts of the CZT(S,Se) photovoltaic device when the CZT(S,Se) photovoltaic device is placed on top of the battery. See below. As also shown in FIG. 7, metal lines 706 may be formed along the top (negative) side of the CZT(S,Se) photovoltaic device.

Figure 8:
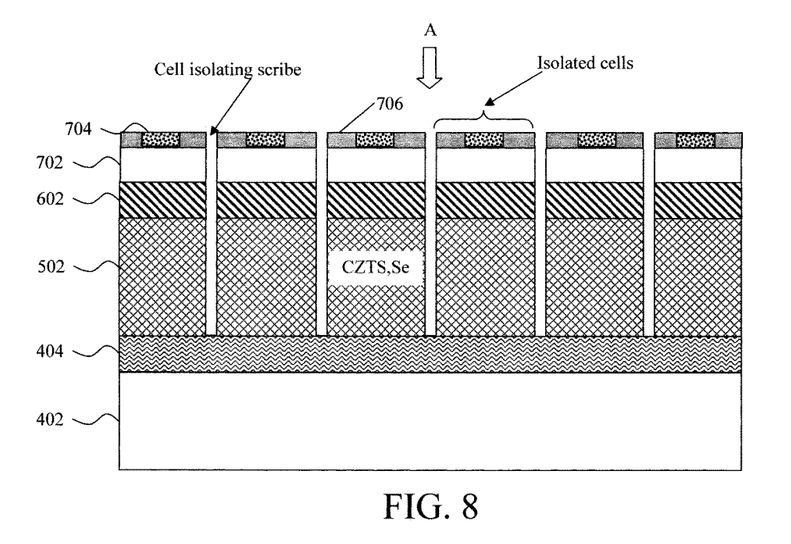
FIG. 8 is a cross-sectional diagram illustrating an isolating scribe having been performed in the CZT(S,Se) photovoltaic device to create a plurality of isolated cells according to an embodiment of the present invention.

As provided above, it is desirable to create a plurality of individual serially-connected cells. To do so, an isolating scribe is next performed to divide the CZT(S,Se) photovoltaic device into multiple cells. See FIG. 8. As shown in FIG. 8, scribe lines are formed in the CZT(S,Se) photovoltaic device (i.e., extending through the metal lines 706, the transparent front contact 702, buffer layer 602, and CZT(S,Se) absorber layer 502) down to the conductive layer 404. As a result, a plurality of isolated cells is formed. It is notable that the conductive layer 404 and substrate 402 will be removed, and replaced with individual positive back contacts. Thus, each cell will eventually be electrically isolated. It is also notable that since the scribe lines are needed to isolate individual cells they need to be done at some point in the process, but not necessarily at the specific point illustrated in FIG. 8. For instance, it is possible to perform the isolating scribe earlier in the process.

Figure 9:
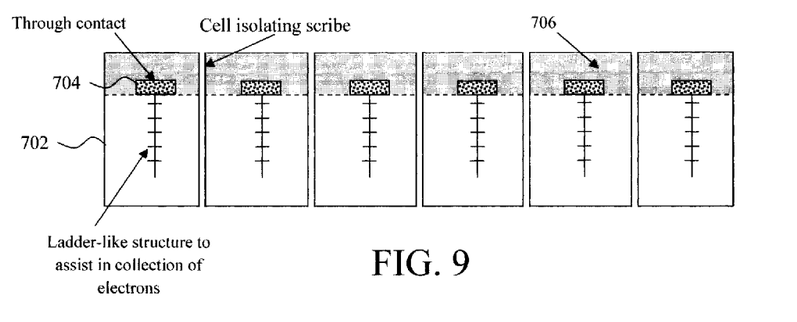
FIG. 9 is a top-down diagram illustrating contacts having been formed that interconnect the top (negative) and bottom (positive) sides of the CZT(S,Se) photovoltaic device according to an embodiment of the present invention.
Figure 10:
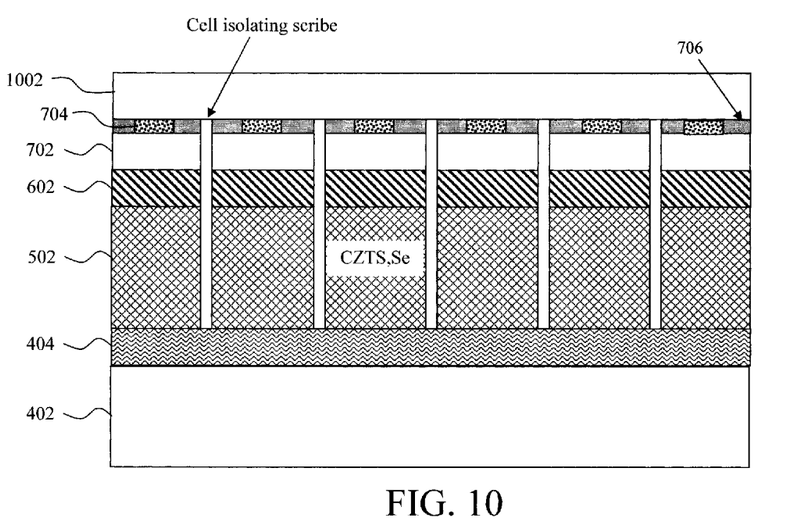
FIG. 10 is a cross-sectional diagram illustrating a transparent plate having been attached to the front of the CZT(S,Se) photovoltaic device according to an embodiment of the present invention.

FIG. 9 is a top-down view of the negative side of the CZT(S,Se) photovoltaic device (for example, from vantage point A, see FIG. 8). FIG. 9 provides a top-down view of the metal grid 704. As shown in FIG. 9, the metal grid 704 includes a ladder-like structure at the top of the CZT(S,Se) photovoltaic device that assists in collection of electrons. Also, as described above, a portion of the metal grid 704 can be configured as a through contact that passes from the top to the bottom of the device stack and thus enables access to the top/negative part of the CZT(S,Se) photovoltaic device from the bottom of the stack. See FIG. 9. To form the through contact portion of metal grid 704, vias may be patterned in the CZT(S,Se) photovoltaic device (down to the conductive layer 404) and then filled with a metal, Cu, Al, and/or Ni. The metal lines 706 can be formed by selectively depositing one or more of these metals using a process such as evaporation (e.g., through a shadow mask).

Switching back to a cross-sectional view, a transparent plate 1002 is next attached to the front of the CZT(S,Se) photovoltaic device. See FIG. 10. According to an exemplary embodiment, plate 1002 includes a transparent glass or polymer plate that is attached to the front of the CZT(S,Se) photovoltaic device using an adhesive such as a clear epoxy. The transparent plate 1002 secures the individual cells, and enables the removal of the underlying conductive layer 404 and substrate 402 (as per step 104 of methodology 100—see above).

Figure 11:
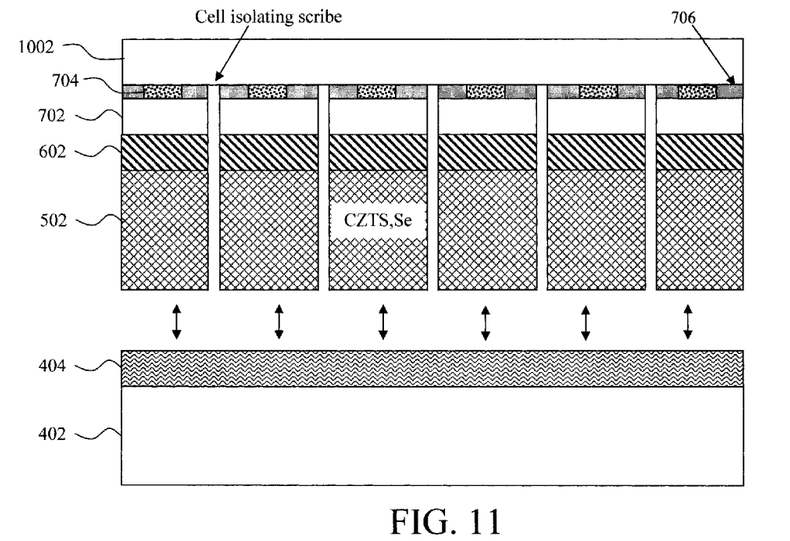
FIG. 11 is a cross-sectional diagram illustrating the transparent plate and CZT(S,Se) photovoltaic device having been separated from the conductive layer and substrate according to an embodiment of the present invention.

Specifically, as shown in FIG. 11 the transparent plate 1002 and CZT(S,Se) photovoltaic device (i.e., transparent front contact 702, buffer layer 602, and CZT(S,Se) absorber layer 502) are separated from the conductive layer 404 and substrate 402. According to an exemplary embodiment, an exfoliation process is employed whereby a sharp impulse on the transparent plate 1002 is used to cleave the CZT(S,Se) photovoltaic device from the conductive layer 404/substrate 402. By way of example only, a square cross-section rod can be placed against the transparent plate 1002 and struck with a hammer. This sideways 'shear' impulse separates the plate+device from the conductive layer+substrate.

The backside surface of the CZT(S,Se) absorber layer 502 (i.e., a side of the CZT(S,Se) absorber layer 502 opposite the buffer layer 602) is now exposed. The conductive layer 404/substrate 402 can be discarded or used in the production of additional CZT(S,Se) photovoltaic devices.

Figure 12:
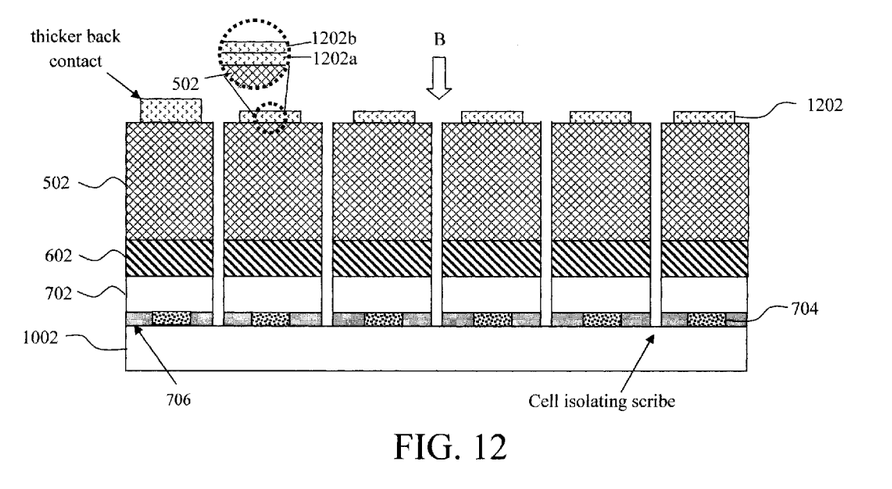
FIG. 12 is a cross-sectional diagram illustrating (positive) back contacts having been formed on the (now exposed) backside surface of the CZT(S,Se) absorber layer according to an embodiment of the present invention.

As per step 106 of methodology 100, at least one (positive) back contact 1202 is next formed on the (now exposed) backside surface of the CZT(S,Se) absorber layer 502. See FIG. 12. In the example shown in FIG. 12, one back contact 1202 is formed for each cell. Thus, each individual cell will have its own back contact 1202. According to an exemplary embodiment, the back contact(s) 1202 is/are formed by first depositing a conductive material 1202a, followed by a capping layer 1202b. See FIG. 12. According to an exemplary embodiment, conductive material 1202a is $MoO_3$, $MoO_2$, alumina ($Al_2O_3$), titanium dioxide ($TiO_2$), and/or selenium (Se), and the capping layer 1202b is Au. In FIG. 12 the device structure is shown flipped such that the backside surface of the CZT(S,Se) absorber layer 502 is now on top. This flipping is done for ease of manufacture such that the additional device layers (i.e., conductive material 1202a, capping layer 1202b, etc.) can be formed sequentially, one on top of the other.

According to one exemplary embodiment, the back contact corresponding to the last cell in the series is thicker than the others since it is that last back contact that will interface with the battery. As will be described below, the other contacts will be covered with an insulating film to isolate them from the battery. Alternatively, another back contact can also be implemented to make (bottom-side) contact to the negative battery terminal (via the through contact—see above). This exemplary embodiment will be described in detail below. In that case, it is desirable to have thicker back contacts at both the beginning (negative −V contact) and at the end (positive+V contact) of the series. See below.

Figure 13:
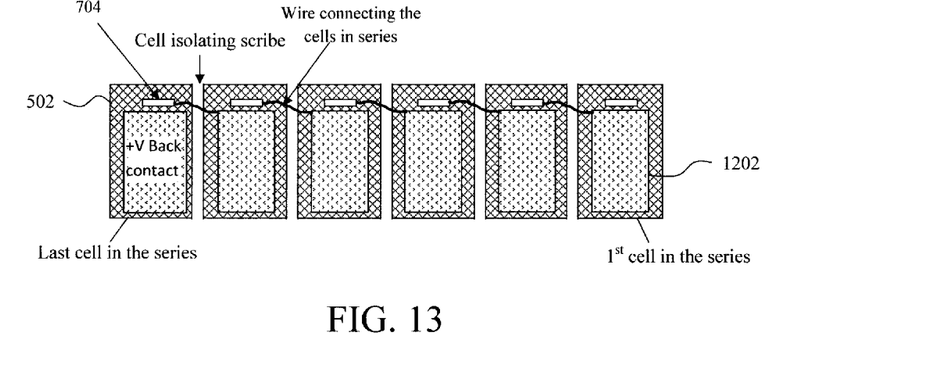
FIG. 13 is a top-down diagram illustrating the (positive) back contacts according to an embodiment of the present invention.

Switching briefly again to a top-down view (this time of the positive side of the CZT(S,Se) device), FIG. 13 depicts (from a vantage point B, see FIG. 12) the (positive) back contacts 1202. As shown in FIG. 13, the through contacts 704 pass from the top (negative) to the bottom (positive—as depicted in FIG. 13) sides of the CZT(S,Se) device. As also shown in FIG. 13, the through contact 704 of one cell is wired to the back contact 1202 of the previous, adjacent cell in the series. That way, as will be described in detail below, the (positive) region of the battery can be simply connected to the last cell in the series.

Figure 14:
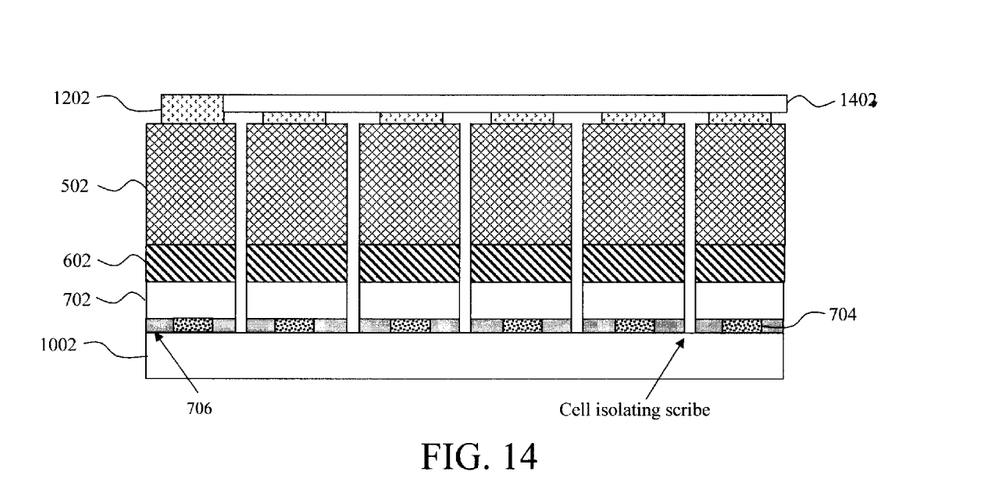
FIG. 14 is a cross-sectional diagram illustrating an insulating film having been deposited onto the positive side of the CZT(S,Se) photovoltaic device covering all but the last back contact in the series according to an embodiment of the present invention.

Next, as shown in FIG. 14, an insulating film 1402 is deposited onto the positive side of the CZT(S,Se) device over all but the last back contact 1202 in the series. The insulating film 1402 will isolate the individual back contacts 1202 from the positive region of the battery save for the last contact with the highest voltage needed to charge the battery. Suitable insulators include, but are not limited to, semiconductor insulators such as an oxide material, plastic, glass, etc.

With the insulating film in place, the CZT(S,Se) photovoltaic device can then be integrated with the battery as per step 108 of methodology 100. See FIG. 15. The CZT(S,Se) photovoltaic device is shown flipped in FIG. 15 such that the back contacts 1202 are facing the positive (+V) battery contact. The CZT(S,Se) photovoltaic device is then placed on top of the battery such that the last back contact 1202 physically contacts the positive battery contact. According to an exemplary embodiment, the CZT(S,Se) photovoltaic device is secured to the battery using an adhesive (such as an epoxy) between the insulating film 1402 and the positive side of the battery.

Figure 15:
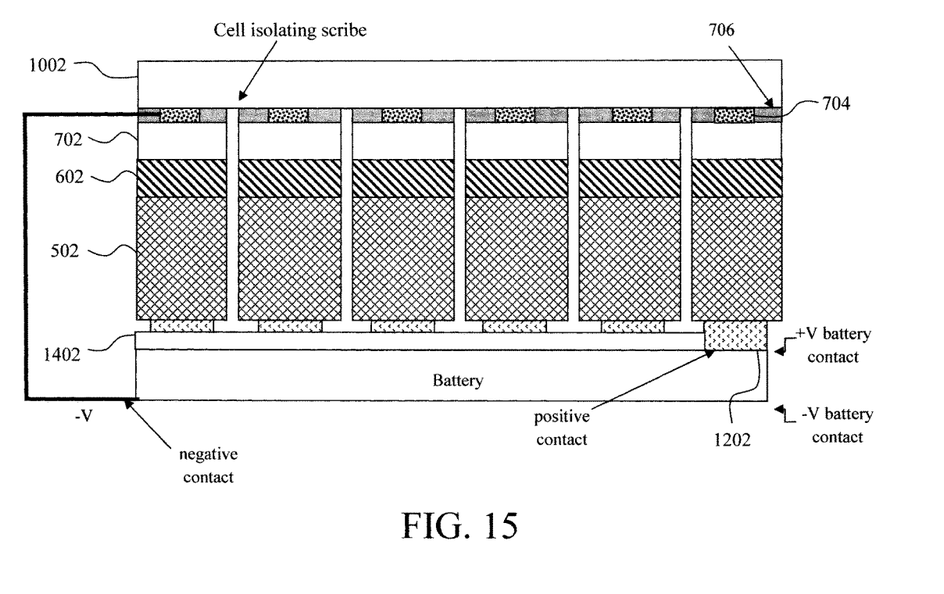
FIG. 15 is a cross-sectional diagram illustrating the CZT(S,Se) photovoltaic device having been integrated with the battery in a stacking configuration according to an embodiment of the present invention.

The insulating film 1402 separates all but the last back contact 1202 from the positive battery contact. Thus, only the last cell in the series is connected to the positive side of the battery. A negative contact is created through a wire (as shown) or via from the metal grid 704 on the front/negative (−V) side of the CZT(S,Se) photovoltaic device to the negative contact on the battery.

In order to simplify the design, and thereby eliminate the need for an added wire/via to connect from the negative battery terminal to the top/negative side of the CZT(S,Se) photovoltaic device, an alternative embodiment is now presented where the through contact portions of the metal grid 704 are accessed in conjunction with a battery design having both positive and negative terminals on the top of the battery. The same general fabrication process is employed and thus, the like structures are numbered alike in the following description.

Figure 16:
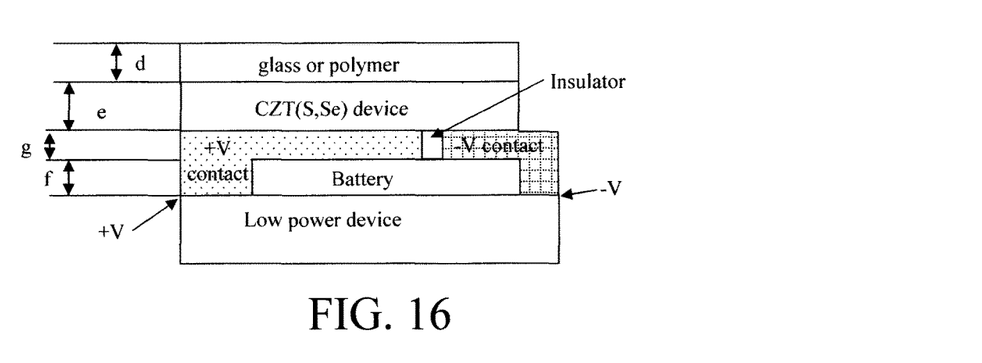
FIG. 16 is a cross-sectional diagram illustrating an alternative exemplary configuration of the integrated CZT(S,Se) photovoltaic device and battery where both the positive and negative connections occur at the bottom of the CZT(S,Se) photovoltaic device and at the top of the battery according to an embodiment of the present invention.

Referring to FIG. 16, an alternative exemplary configuration of the integrated CZT(S,Se) photovoltaic device and battery is shown. As shown in FIG. 16, the CZT(S,Se) photovoltaic device and battery are oriented in a stack. For illustrative purposes, a low power device is shown also integrated in the stack which runs on the power supplied by the battery. Exemplary low power devices (such as IoT devices) that can be powered via this CZT(S,Se) photovoltaic device/battery design were described in detail above. In this example, both positive and negative parts of the battery are present on top of the battery. The CZT(S,Se) photovoltaic device is present on top of the battery such that a positive part of the battery is connected to a back contact on the bottom/positive (+V) side of the CZT(S,Se) photovoltaic device, and a positive part of the battery is connected to another back contact on the bottom/negative (−V) side of the CZT(S,Se) photovoltaic device.

The glass or polymer plate is shown attached to the top of the CZT(S,Se) photovoltaic device. As provided above, this plate is used in the exfoliation process to remove the CZT(S,Se) photovoltaic device from the substrate on which it is fabricated. According to an exemplary embodiment, the glass or polymer plate has a thickness (in this case dimension d) of from about 50 µm to about 2 mm, and ranges therebetween. The CZT(S,Se) photovoltaic device has a thickness e of from about 1 µm to about 5 µm, and ranges therebetween, the battery has a thickness f of from about 400 µm to about 1 mm, and ranges therebetween, and the CZT(S,Se) photovoltaic device and battery are separated by a distance g of from about 100 nanometers (nm) to about 1 mm, and ranges therebetween.

Figure 17:
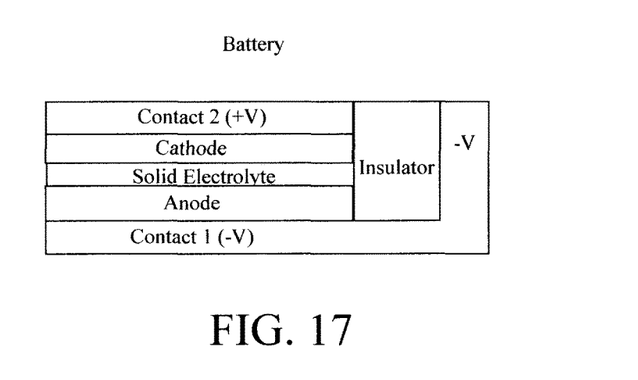
FIG. 17 is a cross-sectional diagram illustrating an alternative exemplary configuration of the battery where both positive and negative battery terminals are at the top of the battery according to an embodiment of the present invention.

An exemplary configuration of the battery is shown in FIG. 17. As shown in FIG. 17, in the same manner as described above, the battery includes a first (negative) contact (contact 1), an anode separated from a cathode by an electrolyte, and a second (positive) contact (contact 2). According to an exemplary embodiment, the battery is a Li-ion battery. Suitable anode, cathode, and electrolyte materials were provided above.

In this example however access to positive and negative contacts is present at the top of the battery. Specifically, a leg of the bottom contact in the battery stack (the negative battery contact in this example) extends (off to one side) up to the top of the stack, and is separated from the layers it passes via an electrical insulator.

Figure 18:
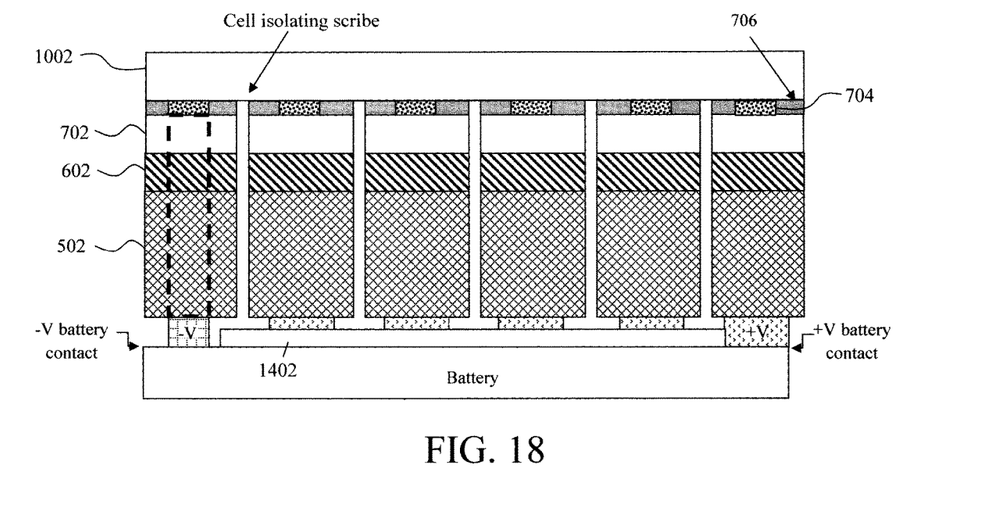
FIG. 18 is a cross-sectional diagram illustrating an alternative exemplary embodiment illustrating an integrated CZT(S,Se) photovoltaic device and battery where a through contact is used to make contact between the negative battery terminal and the top/negative portion of the CZT(S,Se) photovoltaic device according to an embodiment of the present invention.

Thus, when the CZT(S,Se) photovoltaic device is placed on top of the battery, both positive and negative connections occur at the top of the battery/bottom of the CZT(S,Se) photovoltaic device. See FIG. 18. As shown in FIG. 18, the through contact portion of metal grid 704 (shown in dotted lines to illustrate how the through contact passes from the top of the stack through to the bottom of the stack) makes the connection from the negative battery terminal to the negative/top portion of the CZT(S,Se) photovoltaic device.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming an integrated photovoltaic device and battery, the method comprising:
   forming a photovoltaic device having a substrate, an electrically conductive layer on the substrate, an absorber layer on the electrically conductive layer, a buffer layer on the absorber layer, a transparent front contact on the buffer layer, and a metal grid on the transparent front contact;
   removing the substrate and the electrically conductive layer from the photovoltaic device to expose a backside surface of the absorber layer;
   forming at least one back contact on the backside surface of the absorber layer; and
   integrating the photovoltaic device with a battery, wherein the battery comprises a positive contact and a negative contact, and wherein the integrating comprises facing the at least one back contact with the positive contact of the battery, physically connecting the positive contact of the battery with the at least one back contact on the backside surface of the absorber layer and connecting the negative contact of the battery with the metal grid on the transparent front contact.

2. The method of claim 1, wherein the absorber layer comprises a kesterite material.

3. The method of claim 2, wherein the absorber layer comprises copper, zinc, tin, and at least one of sulfur and selenium.

4. The method of claim 3, wherein the absorber layer has a sulfur to selenium ratio of from about 0.05 to about 0.95, and ranges therebetween.

5. The method of claim 1, wherein the battery comprises:
   a cathode adjacent to the positive contact;
   an anode adjacent to negative contact; and
   a solid electrolyte separating the cathode and the anode.

6. The method of claim 5, wherein the battery comprises a lithium ion battery, and wherein the cathode comprises a material selected from the group consisting of: lithium cobalt oxide, lithium iron phosphate, lithium manganese oxide, lithium nickel manganese cobalt oxide, and combinations thereof.

7. The method of claim 5, wherein the anode comprises a material selected from the group consisting of: vanadium(V) oxide, graphite, carbon nanotubes, carbon nanofibers, silicon, germanium, tin, nickel, lithium oxide, titanium oxide, and combinations thereof.

8. The method of claim 5, wherein the solid electrolyte comprises amorphous lithium lanthanum titanate.

9. The method of claim 1, further comprising:
   dividing the photovoltaic device into multiple individual cells.

10. The method of claim 9, wherein the photovoltaic device is divided into the multiple individual cells using an isolating scribe through the transparent front contact, the buffer layer, and the absorber layer.

11. The method of claim 9, wherein forming at least one back contact on the backside surface of the absorber layer comprises
   forming multiple back contacts on the backside surface of the absorber layer one for each of the multiple individual cells.

12. The method of claim 11, further comprising:
   connecting the multiple individual cells in series.

13. The method of claim 12, further comprising:
   connecting the positive contact of the battery with a back contact of a last cell in the series.

14. The method of claim 13, further comprising:
   forming an insulating film covering the multiple back contacts except for the back contact of the last cell in the series.

15. The method of claim 1, further comprising:
   attaching a transparent plate to a front of the photovoltaic device prior to removing the substrate and the electrically conductive layer from the photovoltaic device.

16. The method of claim 15, wherein the transparent plate is selected from the group consisting of: a transparent glass plate and a transparent polymer plate.

17. The method of claim 1, wherein the photovoltaic device is integrated with the battery by placing the photovoltaic device on top of the battery such that the positive contact of the photovoltaic device is in physical contact with the positive contact of the battery.

18. The method of claim 17, further comprising:
creating a negative contact through a wire from the negative contact of the battery to the metal grid on the transparent front contact.

* * * * *